United States Patent
Haga et al.

(10) Patent No.: US 9,851,642 B2
(45) Date of Patent: Dec. 26, 2017

(54) EXPOSURE DEVICE AND EXPOSURE METHOD

(71) Applicant: SONY CORPORATION, Tokyo (JP)

(72) Inventors: Shinsuke Haga, Tokyo (JP); Masaki Ohno, Chiba (JP); Taichi Takeuchi, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 66 days.

(21) Appl. No.: 15/091,005

(22) Filed: Apr. 5, 2016

(65) Prior Publication Data

US 2016/0216614 A1    Jul. 28, 2016

Related U.S. Application Data

(63) Continuation of application No. 12/901,887, filed on Oct. 11, 2010, now Pat. No. 9,333,708.

(30) Foreign Application Priority Data

Oct. 20, 2009   (JP) ................................. 2009-241707

(51) Int. Cl.
    *G03B 27/32*      (2006.01)
    *G03F 7/20*      (2006.01)
    (Continued)

(52) U.S. Cl.
    CPC .......... *G03F 7/704* (2013.01); *B29C 67/0051* (2013.01); *B33Y 30/00* (2014.12); *G03F 7/70191* (2013.01); *G03F 7/70366* (2013.01)

(58) Field of Classification Search
    CPC .. G03F 7/70191; G03F 7/702; G03F 7/70025; G03F 7/70033; G03F 7/70058;
    (Continued)

(56) References Cited

U.S. PATENT DOCUMENTS

| 5,121,256 A | 6/1992 | Corle et al. |
| 5,278,385 A | 1/1994 | Gerome et al. |

(Continued)

FOREIGN PATENT DOCUMENTS

| JP | 11-042713 A | 2/1999 |
| JP | 2001-162687 A | 6/2001 |

(Continued)

*Primary Examiner* — Christina Riddle
(74) *Attorney, Agent, or Firm* — Chip Law Group

(57) ABSTRACT

An exposure device includes a rotation driving section that rotationally drives an exposure object; a light irradiation section that irradiates an exposure surface of the exposure object with laser light; a slide moving section secured to the rotation driving section or the light irradiation section, and moving the rotation driving section or the light irradiation section along the exposure surface in a direction crossing a direction of rotation of the rotation driving section; a signal generating section that transmits an analog modulating signal to the light irradiation section in accordance with a rotation synchronization signal from the rotation driving section, the analog modulating signal causing an intensity of the laser light to be changed; and a controlling section that controls movements of the rotation driving section, the slide moving section, and the light irradiation section.

6 Claims, 15 Drawing Sheets

(51) Int. Cl.
*B33Y 30/00* (2015.01)
*B29C 67/00* (2017.01)

(58) Field of Classification Search
CPC .. G03F 7/70383; G03F 7/704; G03F 7/70725;
G03F 7/70075; G03F 7/70775; G03F
7/70733; G03F 7/70758; G03F 7/70416;
G03F 7/70366; G03F 7/24; G03F 7/2051;
G03F 7/2053; G03F 7/2002; G03F 7/201;
G03F 7/2037; G03F 7/2055; G03F 7/202;
G03F 7/0037; H01L 21/67115
USPC .......... 355/67–77; 250/492.1, 492.2, 492.22,
250/493.1, 548
See application file for complete search history.

(56) References Cited

U.S. PATENT DOCUMENTS

| | | | |
|---|---|---|---|
| 5,289,231 A | | 2/1994 | Magome et al. |
| 6,512,535 B1 | | 1/2003 | Nagasaka et al. |
| 2002/0180944 A1 | * | 12/2002 | Fujii .................. G03F 7/70208 |
| | | | 355/68 |
| 2003/0218667 A1 | | 11/2003 | Williams et al. |
| 2006/0283539 A1 | * | 12/2006 | Slafer ...................... B05D 1/28 |
| | | | 156/230 |
| 2007/0182808 A1 | | 8/2007 | Stiblert et al. |
| 2010/0209857 A1 | | 8/2010 | Martinez |

FOREIGN PATENT DOCUMENTS

| | | |
|---|---|---|
| JP | 2007-301945 A | 11/2007 |
| WO | 2009/027487 A1 | 3/2009 |

* cited by examiner

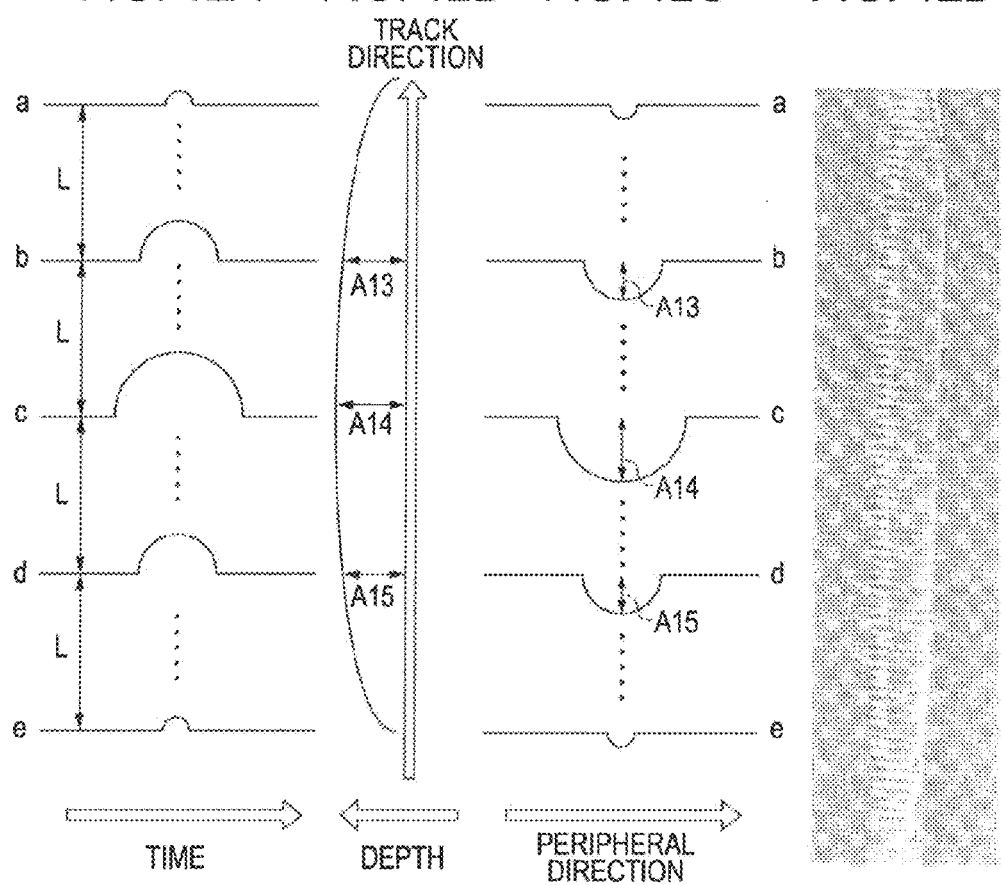

EXPOSURE DEVICE AND EXPOSURE METHOD

CROSS-REFERENCE TO RELATED APPLICATION

The Present application is a Divisional of U.S. application Ser. No. 14/901,887 filed Oct. 11, 2010, which claims priority of Japanese Patent Application JP2009-241707 filed in the Japan Patent Office on Oct. 20, 2009, the entire content of which is hereby incorporated by reference.

BACKGROUND OF THE INVENTION

1. Field of the Invention

The present invention relates to an exposure device, in particular, an exposure device for performing three-dimensional fine processing, and an exposure method.

2. Description of the Related Art

In recent years, development of a three-dimensional processing technology that freely forms a three-dimensional structural member has increasingly been performed. For example, Japanese Unexamined Patent Application Publication No. 2007-301945 (Patent Document 1) discloses a processing method using a stacking formation method. In this method, a thin layer of powder material containing a mixture of thermoplastic resin powder and a soluble filler powder is formed, and portions thereof are arbitrarily selectively sintered with laser. Then, forming of thin layers thereupon and sintering thereof are repeated, to successively stack sintered thin layers upon each other, as a result of which an entire shape is formed. In particular, in the Patent Document 1, after formation, the soluble filler powder is eluted with water, to form a structural member having high porosity.

As a method of forming a three-dimensional structural member by stacking thin layers upon each other, a method that uses liquid as a material as in an optical formation method is provided. In this method, a photo-curable resin is selectively irradiated with a beam, and cured layers are stacked upon each other. For example, Japanese Unexamined Patent Application No. 2001-162687 (Patent Document 2) discloses a method in which, on the basis of two-dimensional slice data, a formation jig is moved along an X axis, an R axis, and a θ axis, and, at the same time, photo-curable resin is blown towards the jig, to perform laser irradiation.

Japanese Unexamined Patent Application Publication No. 11-42713 (Patent Document 3) discloses a method of forming a three-dimensional structure by selectively irradiating a liquid surface of optical-formation resin with pulse light. For the laser light, light in which Nd:YVO$_4$ (wavelength: 106 nm) is set to 355 nm by a high frequency converter is used, and the laser light is converted into a pulse with an ultrasonic transducer. The pulse light two-dimensionally scans the liquid surface using a galvanometer mirror, and selectively cures any location of the liquid surface.

SUMMARY OF THE INVENTION

All of the inventions disclosed in the aforementioned Patent Documents 1 to 3 use what is called a negative material whose light irradiation portion is cured. For the negative material, curing of the material irradiated with the light starts from its front-surface side. Therefore, when the cured portions have not reached, for example, a substrate where the material is disposed, the cured portions float in the material. Therefore, uncured portions are peeled off from the substrate during a process of dissolving the uncured portions by a solvent, as a result of which the structural member is lost.

That is, in order to cure the material from the substrate side, it is necessary to cure the material little by little by the above-described stacking of layers. However, when a three-dimensional structural member is formed by stacking layers upon each other, it is necessary to repeatedly dispose solidifying material on formed solidified layers, and perform laser irradiation.

Since the shape of a side surface of a formed structural member is defined by a layered structure including steps, in order to form a curved surface, it is necessary to maker the layers thinner and increase the number of stacked layers as the precision of forming the curved surface is increased, thereby increasing the number of irradiations. Therefore, it takes a very long time to perform the process, as a result of which the method is not suited to form a large number of three-dimensional structural members at one time. In addition, this method can only use a negative material, that is, it does not allow the use of a positive material.

In the Patent Document 1, since the solidification is performed by sintering powder, a structural member having a size that is smaller than a particle diameter of the powder material cannot be formed. Therefore, this method is actually limited to approximately several tens of microns. In addition, since laser scanning is performed using a mirror, in order to cover the entire area, it is necessary for the laser to reciprocate frequently at a stage. Therefore, it is necessary to perform control of a forward path and a return path, and an irradiation positioning precision is considered as being on the order of microns. This similarly also applies to Patent Document 3. That is, a structural member on the order of nanometers cannot be formed.

The aforementioned Patent Document 2 does not discuss the precision. However, since three-dimensional shapes are all determined by mechanical systems, mechanical precision, itself, becomes the precision of a three-dimensional structural member. A technology for forming a structure on the order of nanometers by mechanical systems is not disclosed in Patent Document 2.

Further, since these methods use high-power lasers, such as ultraviolet lasers and pulse lasers, irradiation systems become expensive. In particular, in Patent Document 2, it is necessary to use a mechanism that blows resin towards a laser irradiation section, thereby increasing the size of the device. In Patent Document 3, since a substrate is exposed while the substrate is immersed in ultraviolet (light) cure resin or the like, the larger the exposure area, the more inefficient the exposure becomes.

Other methods may be used in addition to the above-described methods. An example is a method of forming a die as a three-dimensional structure. The method of forming a roll die used in, for example, roll imprint is roughly divided into mechanical processing and laser processing.

In both of these methods, a roll is rotated by precision positioning using, for example, a rotary encoder; a drill, a laser, or the like is previously caused to abut upon a location to be processed; and patterning is performed. However, this method takes a considerably long time to perform, and is not suitable for processing a large area.

Since the mechanical processing is a contact method, objects that the mechanical processing can process is limited, and processing size is limited depending upon the drill used. On the other hand, since the laser processing is a non-contact method, objects that the laser processing can process is not limited, and processing size of sub-microns is possible if a spot size is made small.

However, since the related laser processing is substantially a mask exposure using excimer laser, and requires an exposure mask, the related laser processing is expensive. In addition, when exposure of an area that is larger than the mask is performed in the mask exposure, joints are formed depending upon positioning precision of the mask.

In view of the above-described problems, according to the present invention, it is desirable to form a three-dimensional structural member whose height changes continuously over a relatively wide area at a low cost and by one exposure operation.

An exposure device according to an embodiment of the present invention includes a rotation driving section that rotationally drives an exposure object; a light irradiation section that irradiates an exposure surface of the exposure object with laser light; a slide moving section secured to the rotation driving section or the light irradiation section, and moving the rotation driving section or the light irradiation section along the exposure surface in a direction crossing a direction of rotation of the rotation driving section; a signal generating section that transmits an analog modulating signal to the light irradiation section, the analog modulating signal causing an intensity of the laser light to be changed; and a controlling section that controls movements of the rotation driving section, the slide moving section, and the light irradiation section. The signal generating section transmits the modulating signal in accordance with a rotation synchronization signal from the rotation driving section.

An exposure method according to an embodiment of the present invention includes the steps of rotating an exposure object; and causing laser light to scan along an exposure surface of the rotating exposure object in a direction crossing a direction of rotation of the exposure object, the exposure surface being irradiated with the laser light. In the exposure method, an intensity of the laser light is modulated in accordance with a rotation period of the exposure object.

That is, according to the exposure device and the exposure method of the embodiments of the present invention, the exposure object, such as a resist, is directly irradiated with the laser light while the intensity of the laser light is changed into analog form. In addition, by irradiating the exposure object with the laser light while rotating the exposure object, the exposure object receives a different amount of laser light depending upon an exposure object position. Further, since a mask is not used, costs can be reduced.

Further, by moving the light irradiation section along the exposure surface in a direction crossing the direction of rotation of the exposure object, it is possible to scan the entire exposure surface with the laser light. In addition, since the laser light is output in accordance with the rotation synchronization signal emitted from the rotation driving section, it is possible to precisely perform patterning on any position of the rotating exposure object.

According to the present invention, it is possible to irradiate the rotating exposure object while continuously changing the intensity of the laser light. Therefore, a three-dimensional structure whose height changes continuously over a relatively wide area can be formed at a low cost and by one exposure process without being limited by the size of a mask or the like.

BRIEF DESCRIPTION OF THE DRAWINGS

FIGS. 12A to 12D illustrate a pattern also formed in a track direction by changing the intensity of laser light, with FIG. 12A showing waveforms of the laser light, FIG. 12B being a sectional view in the track direction of the pattern formed on a positive resist, FIG. 12C being a sectional view in a peripheral direction of the pattern formed on the positive resist, FIG. 12D being a photograph in which the formed pattern is observed from an upper side of the pattern with an electron microscope;

DESCRIPTION OF THE PREFERRED EMBODIMENTS

Figure 1:
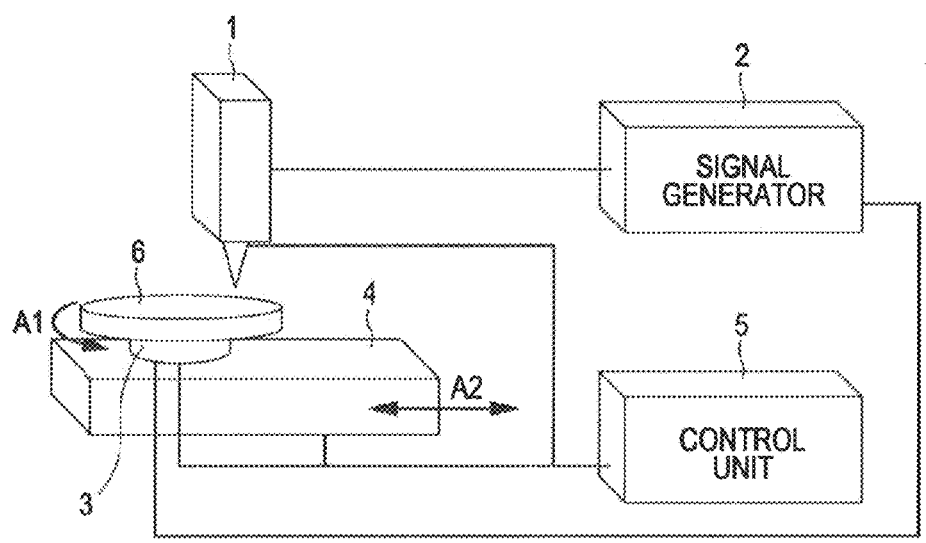
FIG. 1 is a schematic structural view of an exposure device according to a first embodiment of the present invention.

Although best modes for carrying out the present invention are described below, the present invention is not limited to the following modes. The description will be given in the following order:

1. First Embodiment (Exposure Device)
2. Second Embodiment (Exposure Device)
3. Third Embodiment (Exposure Method)
   3-1. Modulating Signal of Laser Light and Structural Member Shape
   3-2. Overlap Exposure
   3-3. Modulation in Track Direction
4. Practical Forms 1. First Embodiment Exposure Device FIG. 1 is a schematic structural view of an exposure device 100 according to a first embodiment of the present invention. The exposure device 100 according to the embodiment includes a light irradiation section 1 that emits laser light, and a signal generating section 2 that transmits a modulating signal of the laser light to the light irradiation section 1. The exposure device 100 also includes a rotation driving section 3 that rotates a laser-light exposure object 6, a slide moving section 4 connected to the rotation driving section 3 and sliding the exposure object 6, and a controlling section 5 that controls the movements of the light irradiation section 1, the rotation driving section 3, and the slide moving section 4.

The exposure device 100 according to the embodiment of the present invention can perform direct laser irradiation. In the exposure device 100, it is desirable to use an exposure technology based on nano-lithography. For a light source of the light irradiation section 1, it is desirable to use a semiconductor laser that can change at a high speed output power on the basis of the amount of electric current, such as a blue-violet semiconductor laser having a wavelength of 405 nm. The light irradiation section 1 includes an objective lens (not shown), and its spot is converged to approximately 50 to 400 nm. Therefore, exposure of a very high resolution is possible.

It is desirable that the objective lens be capable of moving vertically with respect to the exposure object by, for example, a moving mechanism (not shown), and have an auto-focus function with respect to an exposure surface. For example, the movement of the objective lens may be controlled by causing returning laser light reflected by the exposure surface of the exposure object to be incident upon, for example, a position sensor, and by typically setting the distance between the objective lens and the exposure object to a constant distance on the basis of a detection signal of the position sensor using, for example, an off-axis method, a knife edge method, or an astigmatism method.

The rotation driving section 3 may include, for example, a securing mechanism including a vacuum attraction mechanism or a magnet. In addition, the exposure object 6 placed on the top portion of the rotation driving section 3 may be secured thereto by, for example, attracting it thereto. For the exposure object, for example, a silicon wafer or a glass wafer coated with a thick-film positive resist may be used. A resist surface is oriented towards the light irradiation section 1, and secured to the rotation driving section 3.

For the resist, it is desirable to use anything that allows coating of thick films, such as a structural member having a high aspect ratio required for MEMS or the like. A permanent resist having high resistance is desirable because it can be used as it is as a structure material.

As a positive resist, for example, OFPR, PMER-P-RH/RC, PMER-P-LA/HA, PMER-P-CA, PMER-N-CA (all products of Tokyo Ohka Kogyo Co., Ltd.); PFR-GX (product of JSR Corporation); or AZ-P4000 (product of AZ Electronic Materials) may be used.

As a negative resist, for example, SU-8 (product of microchem), or ORDYL, TMMR/TMMF (all products of Tokyo Ohka Kogyo Co., Ltd.) may be used.

When the rotation driving section 3 receives an exposure start signal from the controlling section 5, the rotation driving section 3 rotates, for example, in the direction of arrow A1 at any constant speed, and the laser light emitted from the light irradiation section 1 scans the exposure object 6 in a circumferential direction. The number of rotations is variable from approximately 30 rpm to approximately 6000 rpm, and may be, for example, 1800 rpm.

When the rotation driving section 3 rotates, the rotation driving section 3 transmits a rotation synchronization signal that is in accordance with the rotation speed of the rotation driving section 3 to the signal generating section 2. With reference to the rotation synchronization signal, the signal generating section 2 transmits the modulating signal of the laser light to the light irradiation section 1.

That is, analog modulation of an output of the laser light that is used for the irradiation causes exposure energy to be continuously changed, to control the height of a structural member that is formed. Therefore, in this method, exposure and placement of materials are not repeated as in the stacking method, so that a three-dimensional structure can be freely formed by one exposure process. Therefore, tact time can be greatly reduced compared to that in the related art. In addition, since a mask is not used, costs of producing the mask can be reduced, thereby making it possible to reduce costs. Further, since exposure can be continuously performed without limiting the size of the mask, mask alignment is also not required, thereby making it possible to perform general exposure more precisely on a desired area.

When the slide moving section 4 receives the exposure start signal from the controlling section 5, at the same time that the rotation driving section 3 rotates, the slide moving section 4 moves, for example, at any speed in the direction of arrow A2, that is, a rotation radial direction along, for example, a guide shaft (not shown). The driving can be performed by, for example, a linear motor. Its movement position can be precisely measured with, for example, a linear scale. A movement error amount at this time is, for example, less than or equal to ±3 nm when a target movement amount is 320 nm.

By this, a laser light spot scans a resist of the exposure object like a single stroke of a brush. By setting the movement speed of the slide moving section 4 when necessary, it is possible to expose the entire surface of the resist without any gaps.

Since the exposure is performed like a single stroke of a brush, the modulating signal, which becomes information of a target structural member in a height direction, can be represented as one-dimensional data (serial data). Since the modulating signal is output in accordance with the rotation synchronization signal emitted from the rotation driving section 3, patterning can be precisely performed on any position of the rotating exposure object. Therefore, in addition to exposure, this can be performed for thermal irradiation of any position.

When the exposed resist is developed, the depth of the resist that is dissolved in a developer changes in accordance with exposure energy, so that a three-dimensional structure that is in accordance with the modulating signal of the laser light is formed.

Figure 2:
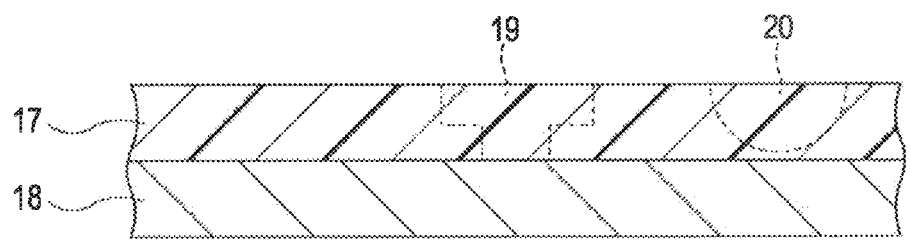
FIG. 2 is a sectional view of an exposure area of a positive resist.
Figure 3:
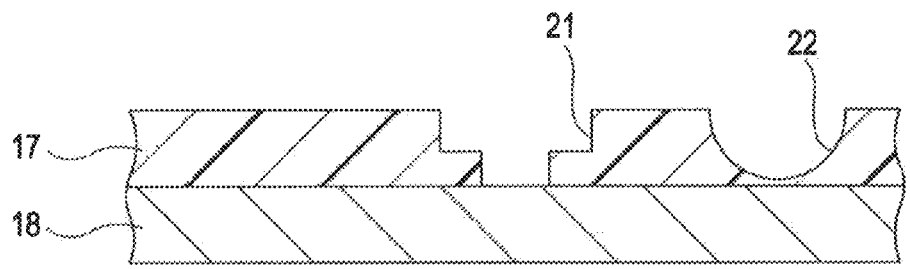
FIG. 3 is a sectional view of a form of the positive resist after development thereof.

For example, as shown in FIG. 2, when the exposure is performed on a positive resist 17 applied to a substrate 18 while changing the intensity of the laser light, areas having depths corresponding to a reception amount of the resist is exposed as with exposure areas 19 and 20 indicated by a broken-line portion, etc. Since the exposure areas are dissolved in the developer, after the development, a structural member whose exposure areas are removed, that is, a structural member having holes 21 and 22 shown in FIG. 3 is formed in the resist 17. In addition, since the modulation of the laser light that is carried out is an analog modulation, it is possible to form a three-dimensional structural member whose height changes smoothly.

In the related optical formation method in Patent Document 3, first, a stage (substrate) is immersed in ultraviolet (light) cure resin, to perform exposure. Then, the stage is slightly lowered, to repeatedly immerse portions cured by the exposure in the ultraviolet cure resin and perform exposure. Therefore, it is necessary to use the ultraviolet cure resin in which the entire exposure object is immersed, and a container having a size that is large enough to fill it with the ultraviolet cure resin and to accommodate the exposure object therein. Consequently, as the area of the exposure object is increased, the amount of ultraviolet cure resin in which the exposure object is immersed and the size of the container are considerably increased, as a result of which the method is not an efficient method.

However, in the exposure device according to the embodiment, since the exposure is performed while directly changing the intensity of the laser light, the coating of thick-film resist is performed only once, which results in efficiency. That is, in order to increase the exposure area, the movement amount of the slide moving section 4 is only increased, thereby facilitating exposure of a large area.

As mentioned above, when the laser-light scanning is performed with, for example, a galvanometer mirror, it is necessary for the laser light to reciprocate along the exposure surface, and to perform control on both a forward path and a return path. In contrast, in the exposure device 100 according to the embodiment, since the laser light scanning is performed by rotating the exposure object and sliding the exposure object in a rotation radial direction, the laser light scanning can be continuously performed like a single stroke of a brush without reciprocating the laser light.

Although the exposure surface may be scanned using an X-Y stage, when exposure is performed while rotating the exposure object as in the embodiment, the entire surface can be scanned by only moving the laser light spot in one direction from a rotation center position in the exposure surface to an outer edge of the exposure surface. Therefore, the tact time and the size of the device are reduced, which is desirable.

As mentioned above, as a negative resist, for example, SU-8 (product of microchem), or TMMR, TMMF (all products of Tokyo Ohka Kogyo Co., Ltd.) may be used. These allow formation of thick films of at least 100 μm by one coating step, such as spin coating. Alternatively, thick films may be formed by overlap coating of the resist.

According to the embodiment of the present invention, when a structural member formed on a substrate is plated with, for example, Ni, it may be used as it is as, for example, a transfer die or mold.

Obviously, the formed structural member may be transferred to a substrate material by etching, such as reactive ion etching (RIE), and used as a die.

2. Second Embodiment

Exposure Device

Figure 4:
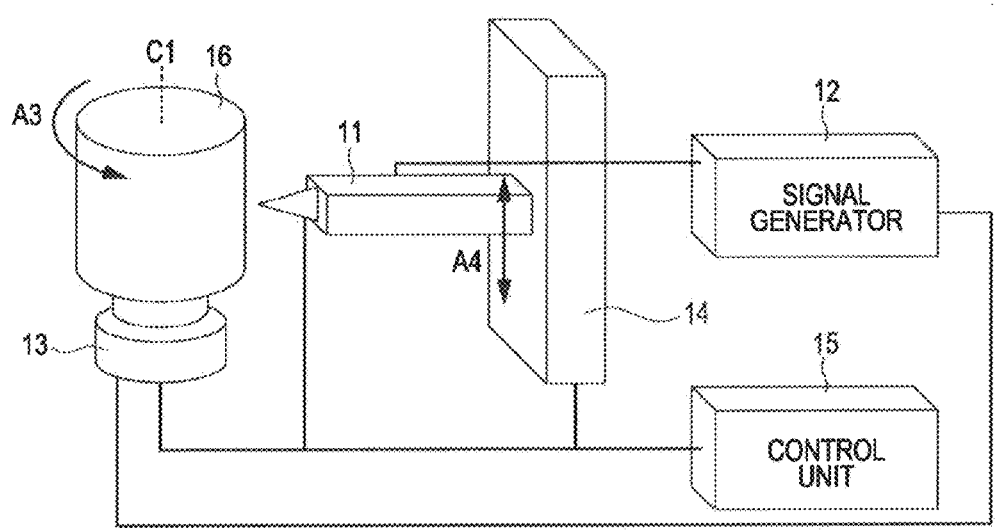
FIG. 4 is a schematic structural view of an exposure device according to a second embodiment of the present invention.

FIG. 4 is a schematic structural view of an exposure device 200 according to a second embodiment of the present invention. The exposure device 200 according to the embodiment includes a light irradiation section 11 that emits laser light, a signal generating section 12 that transmits a modulating signal modulating the laser light to the light irradiation section 11, and a rotation driving section 13 to which an exposure object is placed and secured or that rotates a roll 16 having, for example, a circular cylindrical shape and being the exposure object itself. The exposure device 200 also includes a slide moving section 14 connected to the light irradiation section 11 and moving perpendicularly to a rotation surface of the roll 16. The exposure device 200 further includes a controlling section 15 that controls the movements of the light irradiation section 11, the rotation driving section 13, and the slide moving section 14.

For a light source of the light irradiation section 11, it is desirable to use a blue-violet semiconductor laser as in the first embodiment (FIG. 1). It is desirable for the light irradiation section 11 to include an objective lens (not shown) that converges the laser light on a surface of the exposure object, and to have an auto-focus function for performing a driving operation so that its distance with respect to the exposure object is constant.

In the first embodiment, the entire surface of the exposure object is scanned with the laser light by rotating and sliding the exposure object. In contrast, in the second embodiment, the light irradiation section 11 is secured to the slide moving section 14, and the rotation driving section 13 is separated from the slide moving section 14. That is, when the exposure object is rotated, and the laser light is slid along a rotational axis of the exposure object, the entire outer peripheral surface of the exposure object is scanned.

Therefore, when a start signal is transmitted to the light irradiation section 11, the rotation driving section 13, and the slide moving section 14 from the controlling section 15, a side surface or a roll surface of the roll 16 is irradiated with the laser light from the light irradiation section 11, so that the rotation driving section 13 starts to rotate at any constant speed in, for example, the direction of arrow A3. At the same time, the slide moving section 14 starts to move in the direction of arrow A4, so that scanning using the laser light is performed in a direction parallel to a rotational axis C1 of the roll 16. By this, even in this embodiment, the laser light can scan the surface of the roll 16 like a single stroke of a brush. In addition, at this time, it is possible to thoroughly expose the entire surface of the roll 16 by setting the movement speed of the slide moving section 14 as appropriate.

A rotation synchronization signal that is in accordance with the rotation speed of the rotation driving section 13 is transmitted to the signal generating section 12 from the rotation driving section 13. When the signal generating section 12 transmits an analog modulating signal of the laser light to the light irradiation section 11 in accordance with the rotation synchronization signal thereof, the light irradiation section 11 causes the roll 16 to be irradiated with the laser light whose intensity changes. By this, even in the second embodiment, it is possible to form a three-dimensional structural member whose height changes continuously on the roll 16.

A thin-film substrate to which a resist is applied may be wound around and secured to the surface of the roll 16, or a resist may be directly applied to the roll 16 by, for example, spray coating or a dipping method, to form a three-dimensional structural member directly on the roll 16.

In particular, in the embodiment, it is possible to form any three-dimensional structural member on the surface of the circular cylindrical roll, so that it is possible to plate the roll with, for example, Ni, to use it as a roll imprint die.

When a side surface of the roll is an exposure surface, even if the area of occupation in the device is the same as that in the first embodiment, an exposure surface having a large area can be provided, and the size of the device can be reduced.

Even in the exposure device 200 according to the second embodiment, it is possible to freely form a three-dimensional structure by one exposure process without repeatedly exposing and placing materials. Therefore, tact time can be greatly reduced compared to that in the related art. In addition, since a mask is not used, costs of producing the mask can be reduced, thereby making it possible to reduce costs. Further, since exposure can be continuously performed without limiting the size of the mask, mask alignment is also not required, thereby making it possible to perform general exposure more precisely on a desired area.

3. Third Embodiment

Exposure Method

Next, an exposure method performed by the exposure device of any one of the embodiments of the present invention will be described in detail with reference to an actual example. Here, the term "rotation phase" refers to a phase of rotation of the rotation driving section 3 in the first embodiment (FIG. 1), with a position on a straight line in a radial direction being defined as the same phase when the exposure object 6 shown in FIG. 1 is a disc. In the roll 16 shown in FIG. 4, a position on a straight line that is parallel to the rotational axis on the outer peripheral surface of the roll 16 is defined as the same phase. In addition, the term "track" refers to an area of a path that is scanned with laser light. Therefore, the term "track direction" refers to a widthwise direction of the scanning path, that is, a movement direction of the slide moving section 4; and refers to the rotation radial direction of the rotation driving section 3 in the embodiment shown in FIG. 1, and to a direction along the axis of the roll 16 in the embodiment shown in FIG. 4. The term "track pitch" refers to an interval between adjacent laser light paths.

3-1. Modulating Signal of Laser Light and Structural Member Shape

Figure 5:
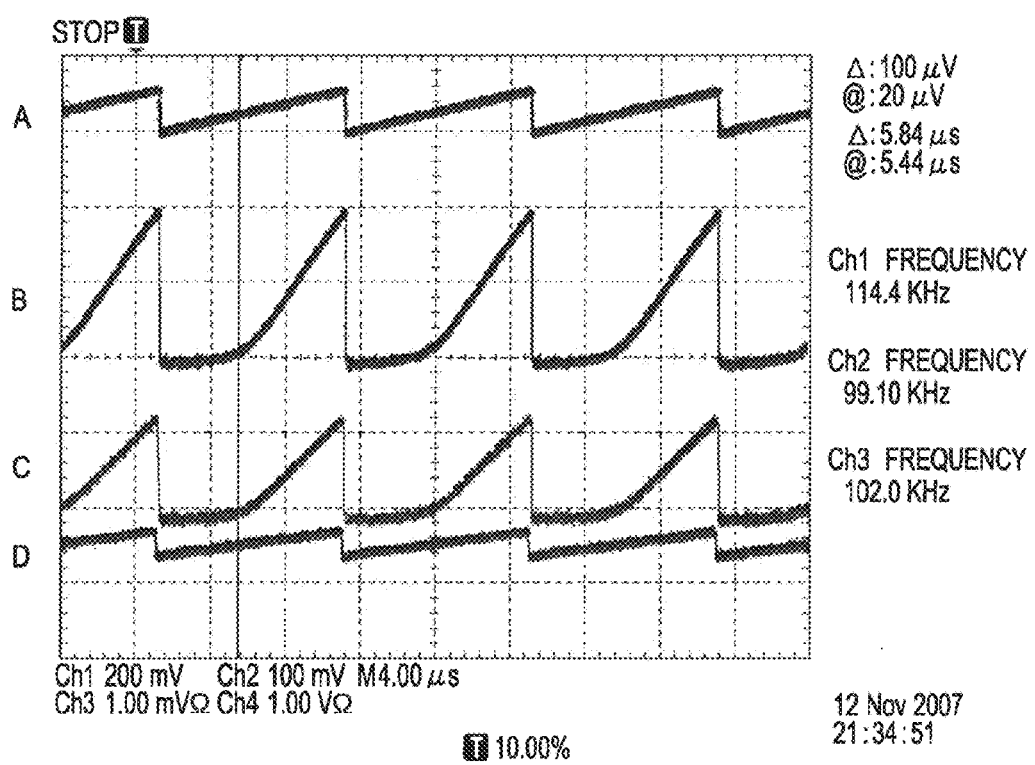
FIG. 5 shows waveforms of optical outputs and input signals of laser light that is emitted, with a waveform A corresponding to an emission command output, a waveform B corresponding to a laser emission waveform emitted on the basis of the waveform A, a waveform C corresponding to an actually measured output obtained by measuring light used to irradiate an exposure object, and a waveform D corresponding to a generator output emitted from a signal generator for forming the waveform A.

FIG. 5 shows exemplary waveforms of optical outputs of laser light output from the light source and input signals input to the laser light source that is output in the exposure device 100 according to the first embodiment. A waveform A corresponds to an emission command output, that is, the modulating signal from the signal generating section 2. Here, a sawtooth wave is transmitted.

A waveform B corresponds to an optical output in which a laser emission waveform emitted on the basis of the waveform A is detected. A waveform C corresponds to an actually measured output obtained by measuring light used to irradiate an exposure object. Since a threshold value exists for the input to the laser until it actually oscillates, the risings of the waveforms B and C of the laser light lag behind that of the waveform A, which is the modulating signal.

A waveform D corresponds to a generator output emitted from the signal generator for forming the waveform A. A blue-violet semiconductor laser having a wavelength of 405 nm and capable of changing power at a high speed on the basis of the amount of electrical current that flows is used as the semiconductor laser.

Figure 6A:
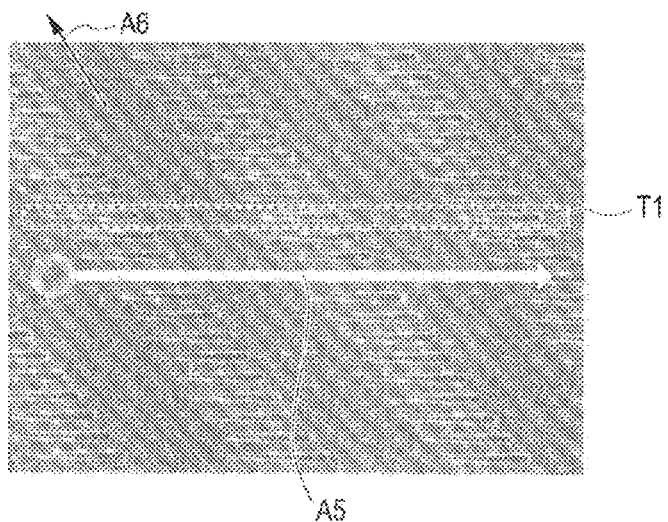
FIG. 6A is a photograph in which a pattern formed on a resist by the exposure device according to the first embodiment is observed from an upper side of the pattern with an electron microscope.

FIG. 6A is a photograph in which exposure is performed using the laser light of the outputs and a developed positive resist is observed from its upper side using a scanning electron microscope (SEM). When the rotation driving section 3 rotates at the same time that the exposure is started, the resist is scanned with a laser light spot in the direction of arrow A5. Therefore, for example, in an area T1, three grooves formed in the resist are continuously exposed with time.

When the laser light spot moves once along the resist by moving the slide moving section 4 of the exposure device 100 shown in FIG. 1, the position of the spot is shifted by one track in the direction of arrow A6. Since the slide moving section 4 moves at a uniform speed, and the signal generating section 2 outputs the modulating signal of the laser light in accordance with a timing of the rotation synchronization signal from the rotation driving section 3, even if the track is moved in the direction of arrow A6 by sliding, laser light having the same phase is output at the same rotation phase position. By this, it can be understood that, in FIG. 6A, an innumerable grooves is arranged and disposed in rows.

Since the rotation speed of the rotation driving section 3 is constant, the laser-light scanning distance per unit time at an inner peripheral side differs from that at an outer peripheral side. However, the signal generating section 2 can change the length of the waveform of a signal that is output in accordance with the scanning speed. Therefore, a pattern that is formed at the inner peripheral side and a pattern that is formed at the outer peripheral side can be exactly the same length and size.

The signal generating section 2 may be programmed so that a modulating signal in which a difference between the scanning speed at the inner peripheral side and the scanning speed at the outer peripheral side is previously incorporated is output. For the second embodiment (FIG. 4), the scanning speed for exposing the surface of the roll (the side surface in FIG. 4) is constant, so that such control can be omitted.

Figure 6B:
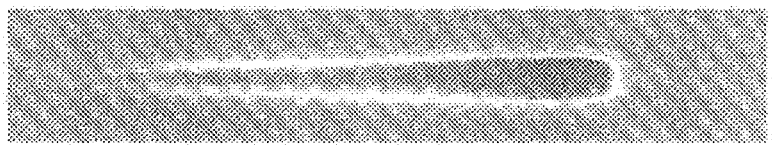
FIG. 6B is an enlarged photograph of FIG. 6A.
Figure 6C:
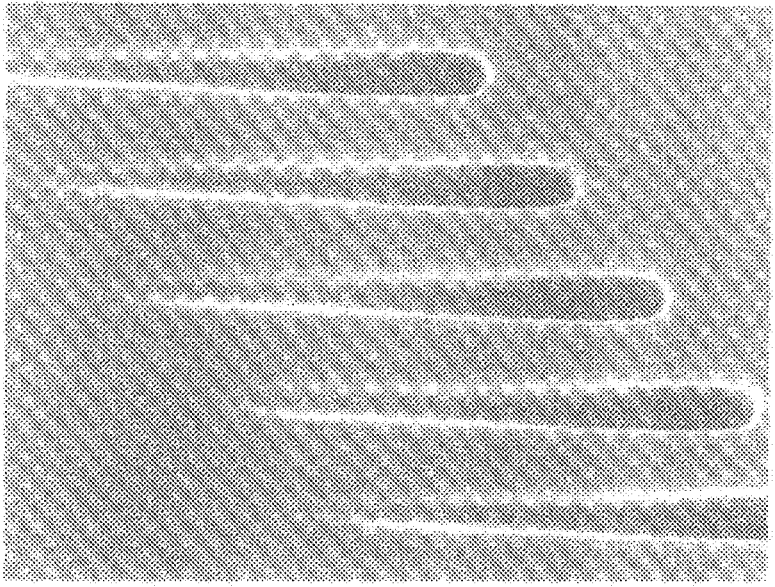
FIG. 6C is an enlarged photograph in which the pattern shown in FIG. 6A is obliquely observed.

FIG. 6B is a photograph in which one of the grooves is enlarged and is observed from directly above the groove. FIG. 6C is a photograph in which an exposure object is obliquely observed at an angle of 13.5 degrees. As can be seen from these figures, three-dimensional shapes whose depths become larger towards the right in FIG. 6C in accordance with the outputs of the laser light shown in FIG. 5 are formed.

Figure 7:
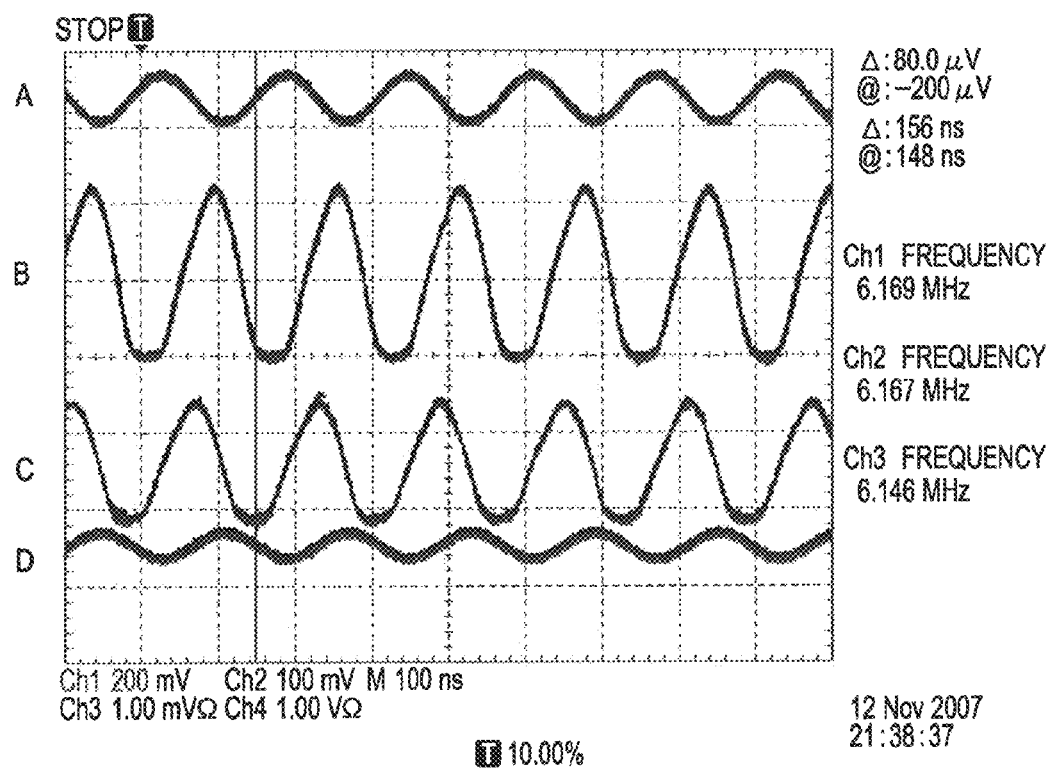
FIG. 7 shows waveforms of optical outputs and input signals of laser light that is emitted, with a waveform A corresponding to an emission command output, a waveform B corresponding to a laser emission waveform emitted on the basis of the waveform A, a waveform C corresponding to an actually measured output obtained by measuring light used to irradiate an exposure object, and a waveform D corresponding to a generator output emitted from a signal generator for forming the waveform A.

Next, a case in which the modulating signal is output as a sine wave to the laser light source is described. FIG. 7 shows exemplary laser optical outputs and input signals input to the laser light source when the sine wave is transmitted by the signal generating section 2. A waveform A is a modulating signal transmitted from the signal generating section 2. A waveform B is an optical output of light in which a laser emission waveform emitted on the basis of the waveform A is detected. A waveform C is an actually measured waveform obtained by measuring light used to irradiate an exposure object. A waveform D corresponds to a generator output from the signal generator.

Figure 8A:
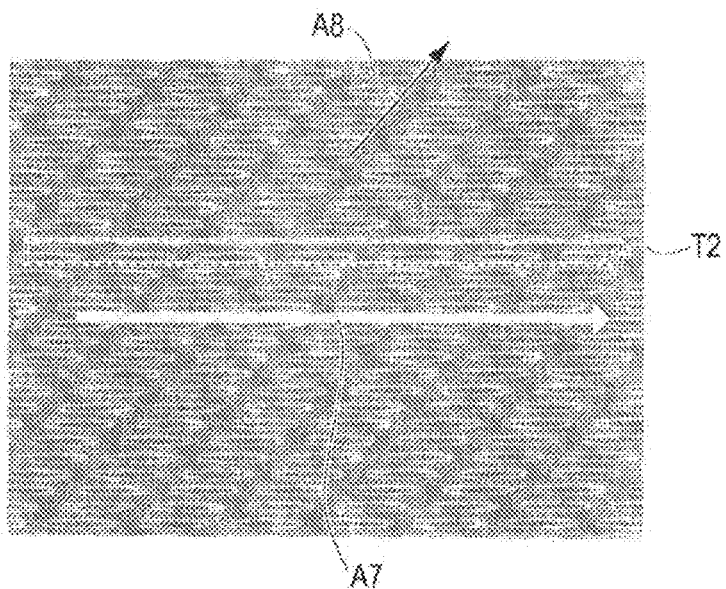
FIG. 8A is a photograph in which a pattern formed on a resist by the exposure device according to the first embodiment is obliquely observed with an electron microscope.

FIG. 8A is a photograph in which exposure is performed using the laser light and a developed positive resist is observed from its upper side. Similarly, in FIG. 8A, when the rotation driving section 3 rotates, the resist is scanned with a laser light spot in the direction of arrow A7. Therefore, for example, grooves formed in an area T2 correspond to locations that are continuously exposed with time. When the laser light spot moves once along the resist, the slide moving section 4 moves by the rotation of the rotation driving section 3, so that the position of the spot is shifted by one track in the direction of arrow A8.

When the modulating signal of the laser light is transmitted in accordance with the synchronization signal from the rotation driving section 3, the rotation phase position of the spot and the phase of the laser light are made to correspond with each other. By this, a plurality of groove rows that are arranged in the direction of arrow A8 in FIG. 8A can be arranged and formed at the corresponding positions in the direction of arrow A8.

Figure 8B:
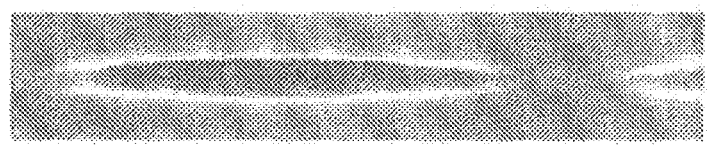
FIG. 8B is an enlarged photograph of FIG. 8A.
Figure 8C:
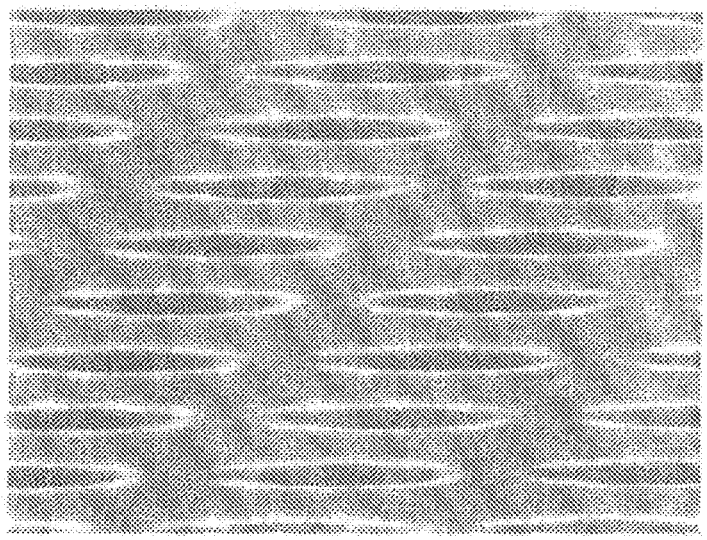
FIG. 8C is an enlarged photograph of FIG. 8A.

FIG. 8B is a top view in which some of the grooves are enlarged and are observed from directly above the grooves. FIG. 8C is a perspective view in which an exposure object is obliquely observed at an angle of 13.5 degrees. Three-dimensional shapes can be uniformly formed. The three-dimensional shapes are shapes in which the depths of the grooves become large once and then become small; and which are in accordance with the sine waveform of the laser light. The heights of the three-dimensional shapes change smoothly.

Threshold values exist for the amount of laser light received for causing a reaction that makes the positive resist soluble in the developer, and for the input electric current for oscillating the laser light. For this reason, since the resist is not exposed at a phase corresponding to a minimum value of the sine wave, the grooves are not connected to each other, and are formed as individual and separated grooves.

In contrast, when the minimum input electrical current value is offset, and the resist is exposed even at a value near the minimum value, it is possible to continuously connect the grooves that are arranged in a scanning direction, and to form shapes similar to sine waves in a cross section of the light irradiation section 1 in the scanning direction. As with other waveforms, such as triangular waves and sawtooth waves, continuous shapes can be formed by offsetting an input value that is input to the light source.

Therefore, according to the exposure method of the embodiment of the present invention, since the exposure is performed while changing the intensity of the laser light on the basis of the modulating light, it is possible to form a shape whose height continuously changes. The existing lithography technique can be used, and is a maskless exposure, so that the cost of the exposure process can be reduced.

3-2. Overlap Exposure

In the above-described exposure method, an example in which, when the laser light spot moves once along the resist, the spot scans a location that is separated from an original exposure position due to the movement of the slide moving section 4 is described. Therefore, what is formed is a shape having a one-dimensional width corresponding to the diameter of the spot of one laser light beam.

Next, an exposure method of forming a three-dimensional structure having a high degree of freedom by causing spot paths to overlap each other, that is, exposure positions to overlap each other as a result of adjusting the movement speed of the slide moving section 4 will be described.

Figure 9:
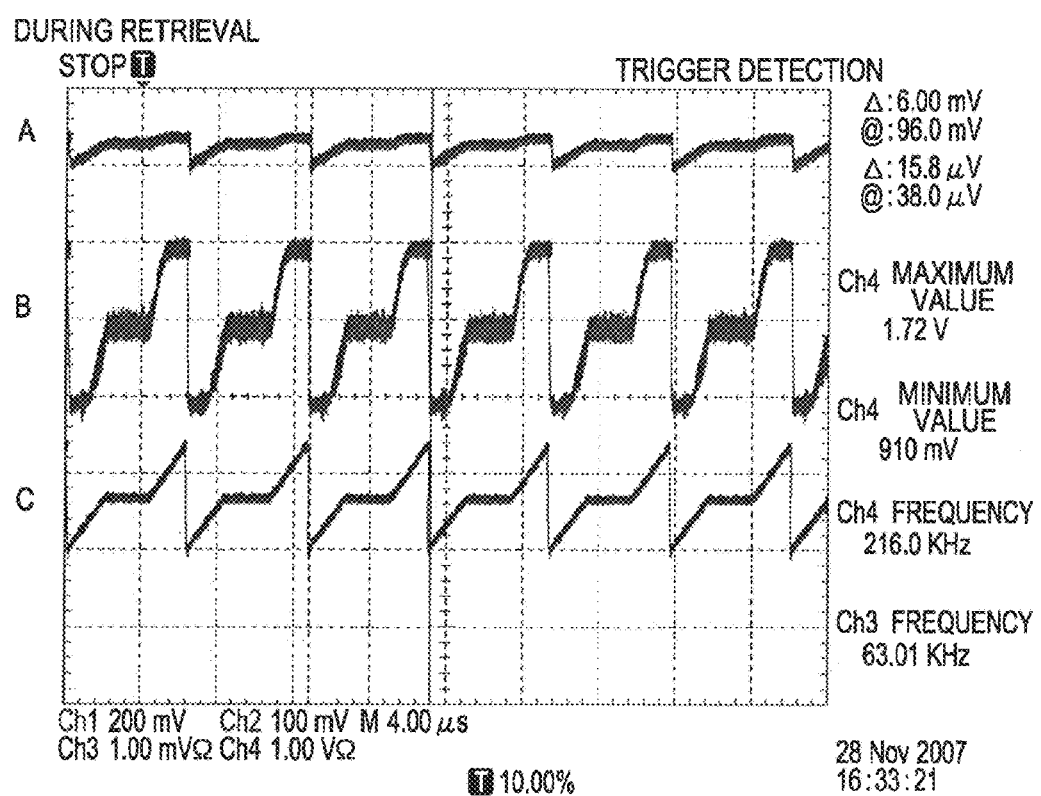
FIG. 9 shows waveforms of optical outputs and input signals of laser light that is emitted, with a waveform A corresponding to an emission command output, a waveform B corresponding to a laser emission waveform emitted on the basis of the waveform A, a waveform C corresponding to an actually measured output obtained by measuring light used to irradiate an exposure object, and a waveform D corresponding to a generator output emitted from the signal generator for forming the waveform A.

FIG. 9 shows exemplary output waveforms of laser light and input signals input to the laser light source in the exposure method according to the embodiment. A waveform A is a modulating signal transmitted from the signal generating section 2. A waveform B is an optical output in which a laser emission waveform emitted on the basis of the waveform A is detected. A waveform C is a generator output from the signal generator. As illustrated, a waveform whose output changes in three steps within one period of a signal waveform is transmitted.

Figure 10:
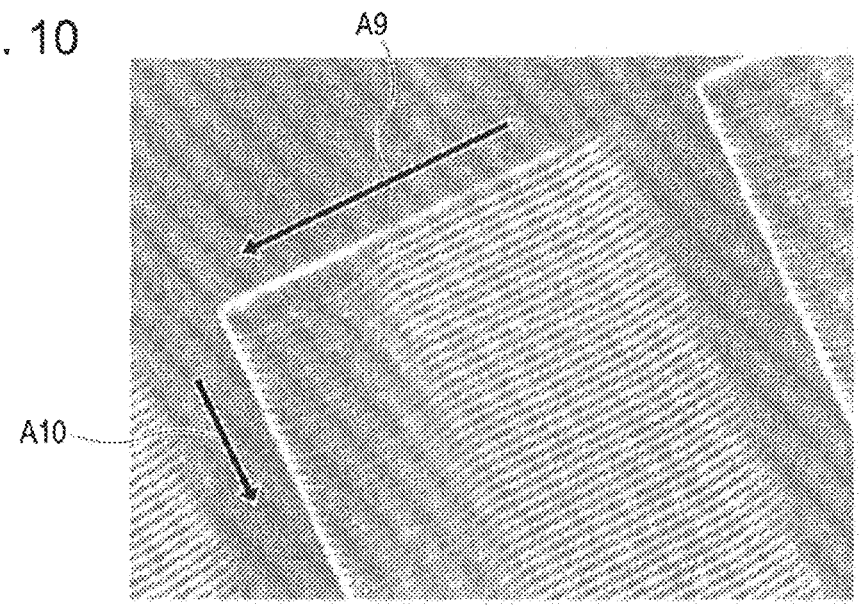
FIG. 10 is an upper side photograph in which a pattern formed on a resist by irradiation with laser light having the waveforms shown in FIG. 9 is observed from an upper side of the pattern with an electron microscope.

For such a signal waveform, the spot diameter of the laser light is narrowed to 400 nm, and the amount of movement of the slide moving section 4 while the rotation driving section 3 rotates once (hereunder referred to as "track pitch") is set to 400 nm, to perform exposure and form a pattern. A photograph in which the developed pattern is seen from its upper side with a SEM is shown in FIG. 10. In FIG. 10, when the rotation driving section 3 of the exposure device 100 shown in FIG. 1 rotates, the laser light spot is used for scanning in the direction of arrow A9 in FIG. 10, so that grooves having three different depths corresponding to the output of the laser light are formed.

By moving the slide moving section 4 in the direction of arrow A10 in FIG. 10, the exposure is performed for every 400 nm pitch, so that the grooves are continuously formed for every 400 nm in the direction of arrow A10. Since the modulating signal of the laser light is transmitted in accordance with the rotation synchronization signal from the rotation driving section 3, laser light having the same phase is output in the direction of arrow A10. For this reason, each groove that is formed is precisely arranged in the direction of arrow A10.

Figure 11:
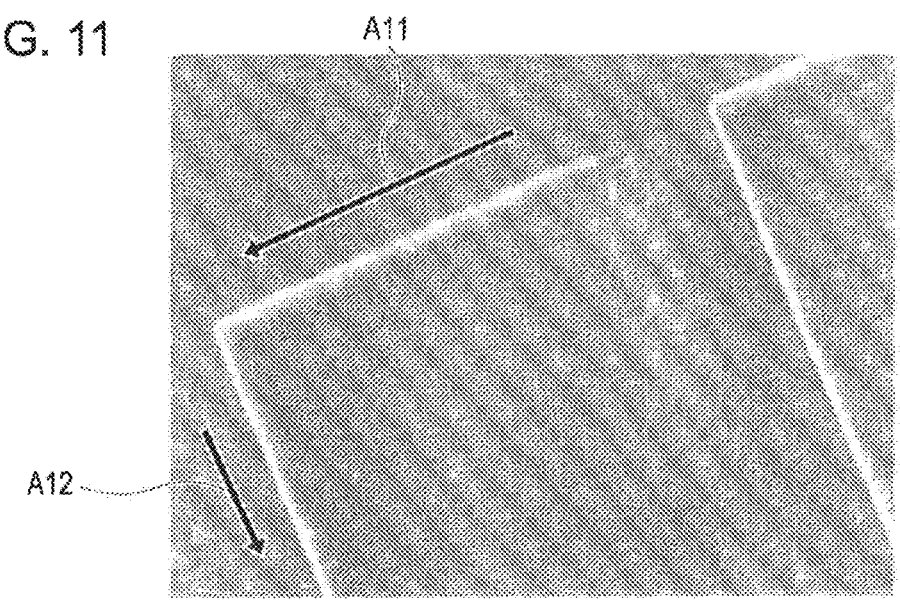
FIG. 11 is a photograph in which a pattern formed on a resist by irradiation with the laser light having the waveforms shown in FIG. 9 with a track pitch being 200 nm is observed from an upper side of the pattern with the electron microscope.

In contrast, FIG. 11 is a photograph in which the track pitch is 200 nm, and a pattern is observed with a SEM when the laser-light spot paths partially overlap each other. Even in FIG. 11, when the rotation driving section 3 rotates, scanning using the laser light is performed in the direction of arrow A11, and the slide moving section 4 is moved in the direction of arrow A12.

Accordingly, when the track pitch is set so that the laser-light spot paths partially overlap each other, a groove formed for each track not only overlaps an adjacent groove, but also can be integrally formed without a joint as shown in FIG. 11. That is, the shapes of the bottom surfaces of the grooves can be substantially smoothly formed. This makes it possible to also freely form a structure that widens in a two-dimensional surface direction.

If the overlapping amount of the laser-light spots for the respective tracks is less than the spot diameter, a groove smoothing effect can be obtained to a certain extent. By causing the grooves to overlap each other by one half of the spot diameter, it is possible to smoothen the shape of a bottommost groove surface. However, the method is not limited thereto. The overlapping amount may be less than one half of the spot diameter, such as about one-tenth of the spot diameter, depending upon, for example, the material of the resist and the shape of the pattern to be formed. If the overlapping amount is zero, it is possible to smoothen the shapes of the grooves to a certain extent.

3-3. Modulation in Track Direction

The above-described exposure method makes it possible to also form a structure that widens in the two dimensional direction without any joints, so that the degree of freedom can be considerably increased. However, in the direction of movement of the slide moving section, if laser light having the same intensity is used for the irradiation, changes in depth do not occur. Therefore, it is desirable that the laser light also be modulated in the track direction.

First, with reference to FIG. 12A to 12D, a case in which a three-dimensional structural member is formed by modulating laser light in the track direction will hereunder be described. FIG. 12A is a schematic sectional view of signal output waveforms output to the laser light source on tracks a to e. FIG. 12B is a schematic sectional view in the track direction of a pattern formed using the laser light of the outputs in FIG. 12A. FIG. 12C is a sectional view in a peripheral direction of the pattern formed using the laser light of the outputs in FIG. 12A. FIG. 12D is a photograph in which the pattern formed using the laser light of the outputs in FIG. 12A is observed from an upper side of the pattern with an electron microscope.

For example, when the laser light of a modulating signal shown in a of FIG. 12A is output, after development, an exposure pattern shown in a of FIG. 12C is formed on a resist. When the rotation driving section 3 and the slide moving section 4 cause scanning using the laser light along the resist once, and the laser light returns to a position having the same rotation phase and being separated by a track pitch L, for example, laser light having an output that is slightly larger as shown in b of FIG. 12A is emitted this time. This causes a pattern shown in b of FIG. 12C that is deeper in the directions of a double-headed arrow A13 to be formed at this location.

Similarly, when the laser-light spot further performs scanning, and returns to the same rotation phase position that is separated by the track pitch L, for example, a modulating signal shown in c of FIG. 12A having a stronger output is transmitted. By this, after development, a pattern formed at this path has a shape that is deeper in the directions of a double-headed arrow A14.

Then, when the laser light, which is based on a modulating signal shown in d of FIG. 12A, performs the exposure again at the position that is separated by the track pitch L, a pattern shown in d of FIG. 12C having a depth in the directions of a double-headed arrow A15 is formed. Similarly, when a laser light, which is based on a modulating signal shown in e of FIG. 12A and which has a smaller output, performs the exposure at the position separated by the track pitch L, a pattern shown in e of FIG. 12C and having a smaller depth is formed.

Accordingly, when the intensity of the laser light is also changed in the track direction, as shown in the cross sectional view in the track direction of FIG. 12B, it is possible to form a shape whose depth also changes in the track direction. The track pitch is 400 nm. In order to change the output of the laser light in the track direction, a modulating signal whose waveform changes with every rotation of an exposure object is output from the signal generating section 3. That is, the modulating signal is such that an output value that is sent out in the same rotation phase of the rotation driving section 3 may differ with time.

Further, if the modulating signal has a waveform in which an output value in the same rotation phase of the rotation driving section 3 is continuous with time, a structure whose height changes continuously and smoothly even in the track direction can be formed.

FIG. 12D is a photograph in which a pattern formed on an exposed positive resist in this way is observed from its upper side with an SEM. In FIG. 12D, a pattern whose depth is largest at a center portion and gradually becomes smaller vertically in the direction of the track can be formed. A striped pattern that is seen in the pattern corresponds to a portion formed by exposure for one track. By adjusting a laser light spot for every track so that the laser light spots overlap each other, it is possible to form a smooth surface without joints.

Accordingly, when the modulating signal is also changed in the track direction and in the peripheral direction of rotation, it is possible to form a three-dimensional shape whose depth changes in various directions in a two-dimensional plane of a resist. Therefore, in this case, it is possible to significantly increase the freedom of designing shapes, which is the aim. For this reason, it is also possible to produce a nonsymmetrical structure such as a micro-flow channel. It may be used as, for example, a transfer die for transfer to polydimethyl siloxane (PDMS).

Figure 13A:
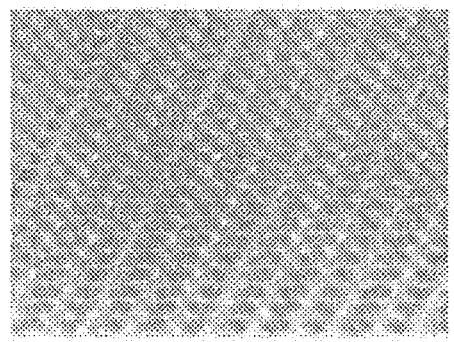
FIG. 13A is a photograph in which a pattern also formed in the track direction by changing the intensity of the laser light is obliquely observed with an electron microscope.

For example, in FIG. 13A, many hemispherical patterns are formed by controlling output power of the laser light and the number of tracks, without any joints and with the track pitch being 200 nm in the exposure pattern shown in FIG. 12. That is, the pattern shown in FIG. 12D is compressed vertically.

Figure 13B:
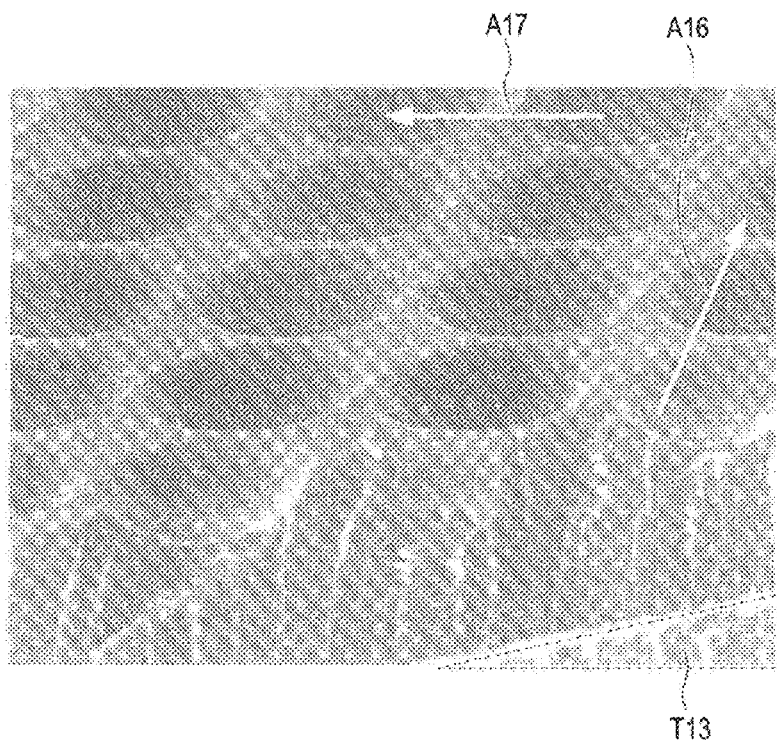
FIG. 13B is an enlarged photograph of FIG. 13A.

The hemispherical patterns are shown in enlarged form in FIG. 13B. In FIG. 13B, the front side is in cross section, and an area T3 corresponds to a quartz glass substrate. The circumferential direction in which the laser light performs scanning by the rotation of the rotation driving section 3 is indicated by an arrow A16. The direction of movement of the slide moving section 4, that is, the track direction is indicated by an arrow A17.

Figure 13C:
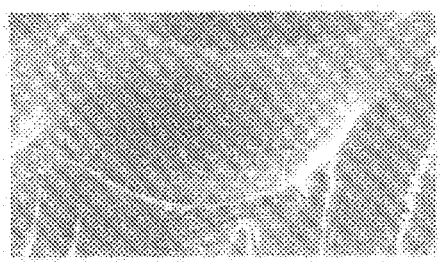
FIG. 13C is an enlarged photograph of FIG. 13B.

Accordingly, by modulating the laser light in the circumferential direction and the track direction, it can be confirmed that hemispherical shapes whose depths change in various directions are also uniformly formed. FIG. 13C is an enlarged view of the cross-sectional portion shown in FIG. 13B. The cross section is formed by sectioning the patterns in a direction differing from the track direction, which obviously also differs from the circumferential direction.

That is, when the track pitch is set so that half of the laser light spots overlap each other, it is possible to form a curved surface whose depth changes continuously and smoothly without any joints or steps in directions other than the laser scanning direction and a laser-light modulation direction.

4. Practical Forms

FIGS. 14 to 25 show patterns formed after development and transferred to a substrate by anisotropic dry etching as a result of performing exposure on a positive resist using an exposure device according to an embodiment of the present invention, and Ni transfer products formed from the patterns formed on the substrate. For the resist, PFR-GX is used, and is applied to a quartz glass substrate. A blue-violet semiconductor laser having a wavelength of 405 nm is used as a laser light source, and the exposure is performed with the spot diameter being 400 nm.

Figure 14:
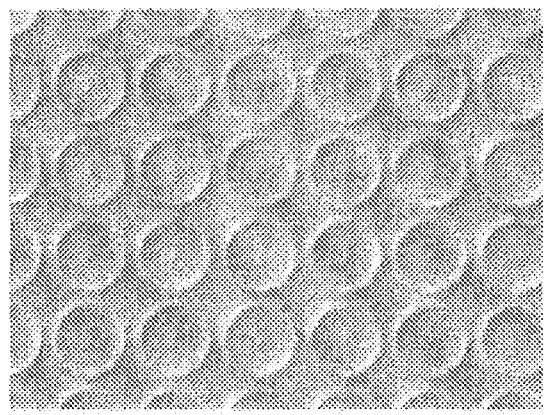
FIG. 14 is a photograph in which a substrate to which a pattern formed on a positive resist by an exposure device according to an embodiment of the present invention is transferred is observed from an upper side of the pattern with an electron microscope.
Figure 15:
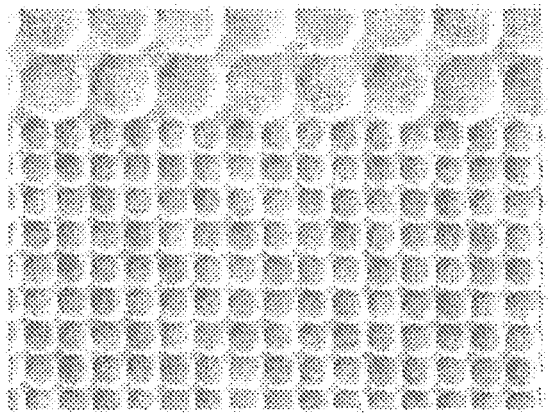
FIG. 15 is a photograph in which a substrate to which a pattern formed on a positive resist by an exposure device according to an embodiment of the present invention is transferred is observed from an upper side of the pattern with an electron microscope.
Figure 16:
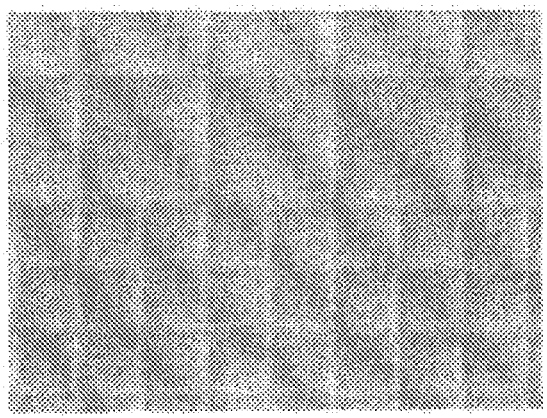
FIG. 16 is a top view of a substrate to which a pattern formed on a positive resist by an exposure device according to an embodiment of the present invention is transferred.
Figure 17:
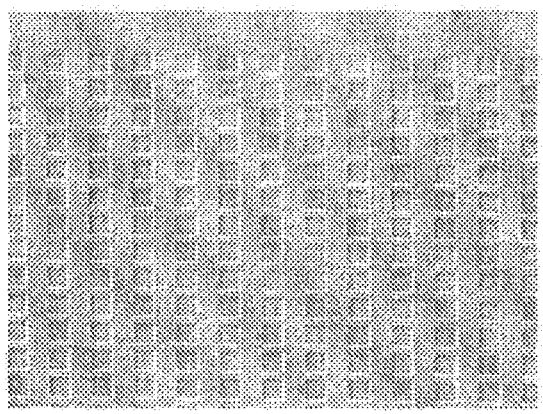
FIG. 17 is a photograph in which a substrate to which a pattern formed on a positive resist by an exposure device according to an embodiment of the present invention is transferred is observed from an upper side of the pattern with an electron microscope.
Figure 18:
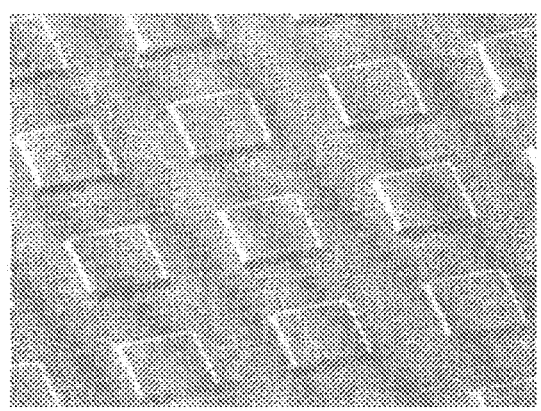
FIG. 18 is a photograph in which a substrate to which a pattern formed on a positive resist by an exposure device according to an embodiment of the present invention is transferred is obliquely observed with an electron microscope.

FIG. 14 shows crater-like shapes formed as a test pattern. FIG. 15 shows hollows having the shape of flat plates. In FIGS. 16 and 17, rectangular patterns are formed. FIG. 18 shows a case in which recesses and protrusions are alternatively formed, with unexposed portions having protruding rectangular shapes.

Figure 19:
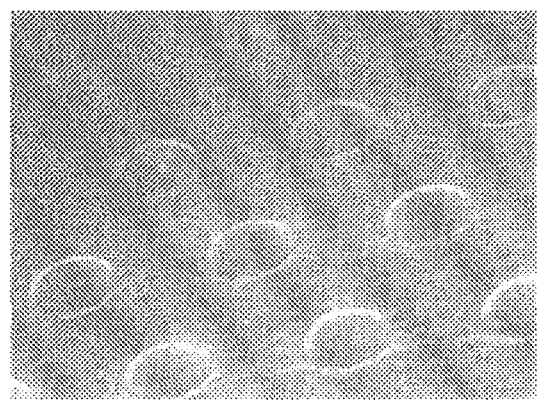
FIG. 19 is a photograph in which a substrate to which a pattern formed on a positive resist by an exposure device according to an embodiment of the present invention is transferred is obliquely observed with an electron microscope.

FIG. 19 shows microlens-like portions. By using an optical material of, for example, a glass substrate, for the substrate, when the optical material is transferred to the substrate from the positive resist, it may be used as it is as an optical part.

Figure 20:
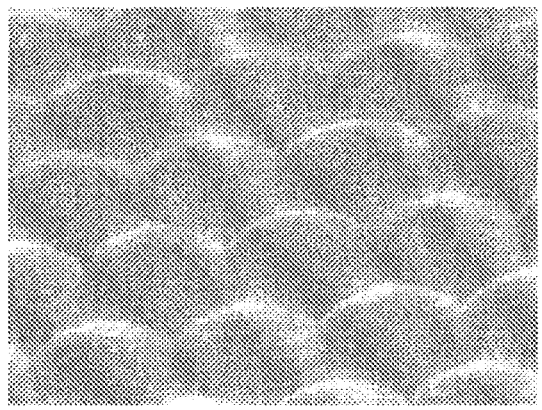
FIG. 20 is a photograph in which a substrate to which a pattern formed on a positive resist by an exposure device according to an embodiment of the present invention is transferred is obliquely observed with an electron microscope.

FIG. 20 shows hexagonal microlens-array-like portions. For example, in an image pickup element, such as a complementary metal-oxide semiconductor (CMOS) image sensor, for increasing image resolution, the number of pixels is increased, so that pixel size is reduced accordingly. Therefore, a lens disposed on each pixel is similarly reduced in size, thereby making it possible to use an exposure device according to an embodiment of the present invention in manufacturing a die for each lens.

Figure 21:
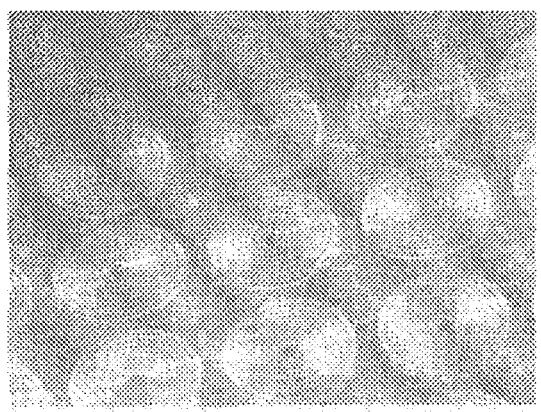
FIG. 21 is a photograph in which a substrate to which a pattern formed on a positive resist by an exposure device according to an embodiment of the present invention is transferred is obliquely observed with an electron microscope.

FIG. 21 shows a Fresnel lens pattern. As a method of forming a fine three-dimensional structure, an exposure method using, for example, a gray scale mask is hitherto provided. For example, a method of adjusting the quantity of light transmitted through a mask by forming a very large number of openings in a thin metal film on a glass substrate and by changing the sizes of the openings, and a method using, for example, a mask formed of emulsion glass are provided. However, in these methods, due to diffraction of light passing through the mask, it is difficult to form a shape having an acute-angle peak or a vertical surface at the same time. It becomes more difficult as the size is reduced.

However, in an exposure device according to an embodiment of the present invention, since the resist is directly irradiated while changing the intensity of the laser light, it is possible to precisely form even a shape having an acute-angle peak, such as that of a Fresnel lens.

Figure 22:
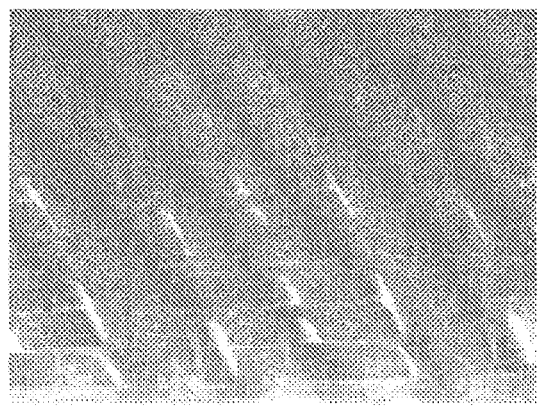
FIG. 22 is a photograph in which a substrate to which a pattern formed on a positive resist by an exposure device according to an embodiment of the present invention is transferred is obliquely observed with an electron microscope.

FIG. 22 shows a swastika pattern. If a metallic film, such as an Au film, is formed on a substrate, and transferred to a metal, it is possible to form a photonic crystal having a polarizing function that rotates a transmission zeroth-order light.

Figure 23:
FIG. 23 is a photograph in which a substrate to which a pattern formed on a positive resist by an exposure device according to an embodiment of the present invention is transferred is obliquely observed with an electron microscope.
Figure 24:
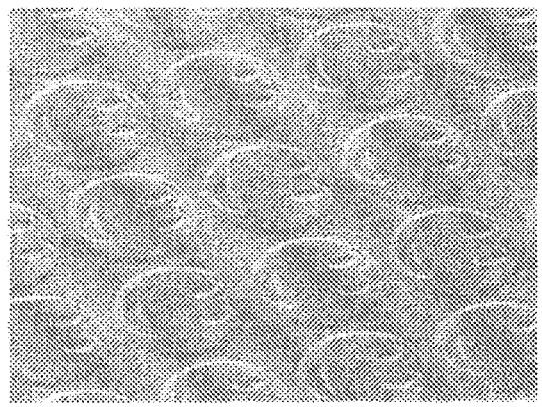
FIG. 24 is a photograph in which a substrate to which a pattern formed on a positive resist by an exposure device according to an embodiment of the present invention is transferred is obliquely observed with an electron microscope.
Figure 25:
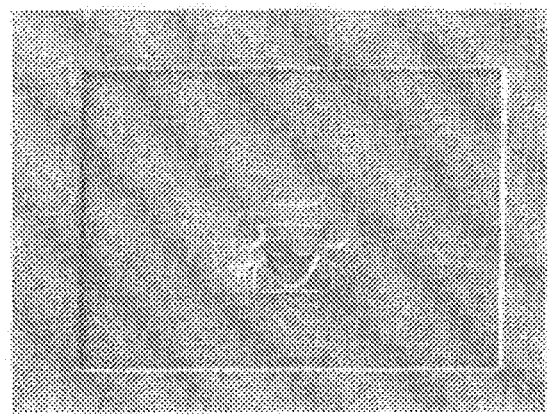
FIG. 25 is a photograph in which a substrate to which a pattern formed on a positive resist by an exposure device according to an embodiment of the present invention is transferred is observed from an upper side of the pattern with an electron microscope.

FIG. 23 shows a rectangular pattern like that shown in FIG. 18 that can be three-dimensionally observed from a small angle. FIGS. 24 and 25 show figure patterns. Even such complicated three-dimensional shapes can be clearly formed.

Although not indicated here, the present invention may be used to form a fine pattern on the order of sub-nanometers, such as a wire grid or a moth eye, or to form a rotary encoder or a rotary scale.

The exposure device and the exposure method according to the embodiments of the present invention are described above. However, the present invention is not limited thereto. Various forms that can be conceived are included in the present invention as long as they do not depart from the gist of the present invention set forth in the claims.

What is claimed is:

1. A film manufacturing method, comprising:
   forming a roll die used in roll imprint; and
   transferring a pattern on the roll die to a film substrate,
      wherein the forming the roll die comprises:
         rotating an exposure object and generating a rotational synchronization signal;
         causing a laser light to scan along an exposure surface of the rotating exposure object in a direction crossing a direction of rotation of the exposure object, the exposure surface is irradiated with the laser light; and
         modulating an intensity of the laser light in accordance with the rotational synchronization signal,
            wherein the intensity of the laser light is modulated in accordance with a rotation period of the exposure object,
            wherein the intensity of the laser light with which the exposure object is irradiated in a same rotation phase of the exposure object is changed with time, and
            wherein a minimum value of the intensity of the laser light is lower than a threshold value of an amount of the laser light received for causing a reaction that makes the exposure object soluble in a developer; and
         forming grooves separated from each other on the exposure object.

2. The film manufacturing method according to claim 1, wherein the intensity of the laser light with which the exposure object is irradiated in the same rotation phase of the exposure object is continuously changed.

3. The film manufacturing method according to claim 1, wherein a movement amount for the laser light to scan the exposure surface per rotation of the exposure object is less than a spot diameter of the laser light per rotation period of the exposure object.

4. The film manufacturing method according to claim 3, wherein the movement amount for the laser light to scan the expose surface per rotation of the exposure object is greater than or equal to ½ of the spot diameter of the laser light per rotation period of the exposure object, and is less than the spot diameter.

5. The film manufacturing method according to claim 1, wherein the exposure object is a positive resist.

6. The film manufacturing method according to claim 1, wherein the exposure surface is a roll surface of a rotating roll, and wherein the laser light is configured to scan the roll surface along a direction of a rotational axis of the rotating roll.

* * * * *